(12) United States Patent
Kim et al.

(10) Patent No.: US 10,705,271 B2
(45) Date of Patent: Jul. 7, 2020

(54) DISPLAY DEVICE

(71) Applicant: Samsung Display Co., Ltd., Yongin-si, Gyeonggi-do (KR)

(72) Inventors: Soo Dong Kim, Hwaseong-si (KR); Sung Woon Kim, Yongin-si (KR); Jang Wi Ryu, Seoul (KR); Kyoung Won Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/017,936

(22) Filed: Jun. 25, 2018

(65) Prior Publication Data

US 2019/0179065 A1    Jun. 13, 2019

(30) Foreign Application Priority Data

Dec. 7, 2017  (KR) .......................... 10-2017-0167718

(51) Int. Cl.
| | |
|---|---|
| *G02B 5/20* | (2006.01) |
| *H01L 27/32* | (2006.01) |
| *G02B 5/22* | (2006.01) |
| *H01L 51/52* | (2006.01) |

(52) U.S. Cl.
CPC .............. *G02B 5/201* (2013.01); *G02B 5/223* (2013.01); *H01L 27/322* (2013.01); *H01L 51/5284* (2013.01); *G02F 2201/121* (2013.01); *G02F 2201/123* (2013.01); *H01L 27/3211* (2013.01)

(58) Field of Classification Search
None
See application file for complete search history.

(56) References Cited

U.S. PATENT DOCUMENTS

| | | | | |
|---|---|---|---|---|
| 10,281,767 | B2* | 5/2019 | Yoon ................. | G02F 1/133617 |
| 2007/0075627 | A1* | 4/2007 | Kimura ............... | H01L 27/3213 |
| | | | | 313/503 |
| 2015/0340410 | A1* | 11/2015 | Hack .................. | H01L 51/5265 |
| | | | | 257/40 |
| 2015/0349030 | A1* | 12/2015 | Ono .................... | H01L 51/5284 |
| | | | | 257/40 |
| 2015/0349034 | A1* | 12/2015 | Hack .................. | H01L 27/3218 |
| | | | | 257/40 |
| 2016/0312118 | A1* | 10/2016 | Fiedler ............... | C09K 11/7728 |

(Continued)

FOREIGN PATENT DOCUMENTS

| | | |
|---|---|---|
| KR | 10-2016-0017373 A | 2/2016 |
| KR | 10-2016-0110173 A | 9/2016 |

(Continued)

*Primary Examiner* — Walter H Swanson
*Assistant Examiner* — Kien C Ly
(74) *Attorney, Agent, or Firm* — Lewis Roca Rothgerber Christie LLP (57) ABSTRACT

A display device includes: a display panel; and a color conversion panel overlapping the display panel, wherein the color conversion panel includes a red color conversion layer and a green color conversion layer including a semiconductor nanocrystal, and a transmissive layer; a red color filter overlapping the red color conversion layer; a green color filter overlapping the green color conversion layer; and a blue color filter overlapping the transmissive layer and a light blocking member, and the light blocking member includes at least one of a blue dye and a blue pigment.

19 Claims, 9 Drawing Sheets

(56) References Cited

U.S. PATENT DOCUMENTS

2017/0054053 A1* 2/2017 Jeon .................... H01L 25/0753
2017/0207281 A1* 7/2017 Hack ................... H01L 27/3206
2017/0276997 A1* 9/2017 Yoshinaga ............. H05B 33/12

FOREIGN PATENT DOCUMENTS

| KR | 10-2017-0000147 A | 1/2017 |
| KR | 10-2017-0051764 A | 5/2017 |

* cited by examiner

DISPLAY DEVICE

CROSS-REFERENCE TO RELATED APPLICATION

This application claims priority to and the benefit of Korean Patent Application No. 10-2017-0167718 filed in the Korean Intellectual Property Office on Dec. 7, 2017, the entire contents of which are incorporated herein by reference.

BACKGROUND

1. Field

The present disclosure relates to a display device.

2. Description of the Related Art

A display device including a light-emitting element may implement red, green, and blue colors, etc., depending on a wavelength of emitted light. A light loss may be generated in the display device such as an organic light emitting diode display using a color filter.

To implement a display device with reduced light loss caused by the color filter and having high color reproducibility, a display device including a color conversion panel using semiconductor nanocrystals such as quantum dots has been proposed.

The above information disclosed in this Background section is only for enhancement of understanding of the background of the subject matter of the present disclosure, and therefore, it may contain information that does not form the prior art that is already known in this country to a person of ordinary skill in the art.

SUMMARY

Exemplary embodiments are directed toward providing a display device with improved color reproducibility and luminance through balanced external light reflection.

A display device according to an exemplary embodiment includes a display panel and a color conversion panel overlapping the display panel, wherein the color conversion panel includes: a red color conversion layer and a green color conversion layer including a semiconductor nanocrystal, and a transmissive layer; a red color filter overlapping the red color conversion layer; a green color filter overlapping the green color conversion layer; and a blue color filter and a light blocking member overlapping the transmissive layer, and the light blocking member includes at least one of a blue dye and/or a blue pigment.

Plane areas of the red color conversion layer, the green color conversion layer, and the transmissive layer may be different from one another.

Each plane area of the red color conversion layer and the green color conversion layer may be larger than the plane area of the transmissive layer.

The plane areas of the red color filter, the green color filter, and the blue color filter may be different from one another.

Each plane area of the red color filter and the green color filter may be larger than the plane area of the blue color filter.

In the color conversion panel, a unit including the red color filter, the green color filter, the blue color filter, and the light blocking member may be repeatedly disposed.

As the area occupied with the light blocking member is decreased in the unit, a content of the blue dye or the blue pigment included in the light blocking member may be increased.

The light blocking member may include carbon black, and the content of the carbon black may be increased as the area occupied with the light blocking member is increased in the unit.

The display panel may emit blue light.

The color conversion panel may include a substrate, the red color filter, the green color filter, and the blue color filter may be positioned between the substrate and the display panel, and the red color conversion layer, the green color conversion layer, and the transmissive layer may be disposed between the red color filter and the display panel.

A planarization layer may be positioned between the red color filter and the red color conversion layer, between the green color filter and the green color conversion layer, and between the blue color filter and the transmissive layer.

A metal reflective layer positioned in at least one among between the light blocking member and the red color filter, between the light blocking member and the green color filter, and between the light blocking member and the blue color filter may be further included.

A display device according to an exemplary embodiment includes a display panel and a color conversion panel overlapping the display panel, wherein the color conversion panel includes: a red color conversion layer and a green color conversion layer including a semiconductor nanocrystal, and a transmissive layer; a red color filter overlapping the red color conversion layer; a green color filter overlapping the green color conversion layer; and a blue color filter and a light blocking member overlapping the transmissive layer, and each plane area of the red color conversion layer and the green color conversion layer is larger than the plane area of the transmissive layer.

A reflective blue color filter positioned on the same layer as the blue color filter may be further included.

The display panel may include a light emitting diode (LED) coupled to (e.g., connected to) a thin film transistor, and the light emitting diode (LED) may include a pixel electrode coupled to (e.g., connected to) the thin film transistor, a common electrode overlapping the pixel electrode, and an emission layer positioned between the pixel electrode and the common electrode.

The red color conversion layer, the green color conversion layer, and the transmissive layer may overlap the emission layer.

A planarization layer positioned between the red color conversion layer and the green color conversion layer, and the display panel, and between the transmissive layer and the display panel, may be further included.

The planarization layer may overlap the reflective blue color filter.

The common electrode may include a first region overlapping the red color filter, the green color filter, and the blue color filter, and a second region overlapping the reflective blue color filter, and a thickness of the common electrode positioned in the first region and the second region may be differentiated.

The thickness of the common electrode positioned at the first region may be smaller than the thickness of the common electrode positioned at the second region.

According to exemplary embodiments, the red light, the green light, and the blue light may be uniformly (e.g., substantially uniformly) reflected, the color reproducibility of the display device may be improved, and the display device having excellent luminance may also be provided.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

The subject matter of the present disclosure will be described more fully hereinafter with reference to the accompanying drawings, in which exemplary embodiments of the present disclosure are shown. As those skilled in the art would realize, the described embodiments may be modified in various different ways, all without departing from the spirit or scope of the present disclosure.

In order to clearly explain the subject matter of the present disclosure, portions that are not directly related to the subject matter of the present disclosure may be omitted, and the same reference numerals are attached to the same or similar constituent elements through the entire specification.

In addition, the size and thickness of each configuration shown in the drawings may be arbitrarily shown for better understanding and ease of description, but the present disclosure is not limited thereto. In the drawings, the thickness of layers, films, panels, regions, areas, etc., may be exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

Figure 1:
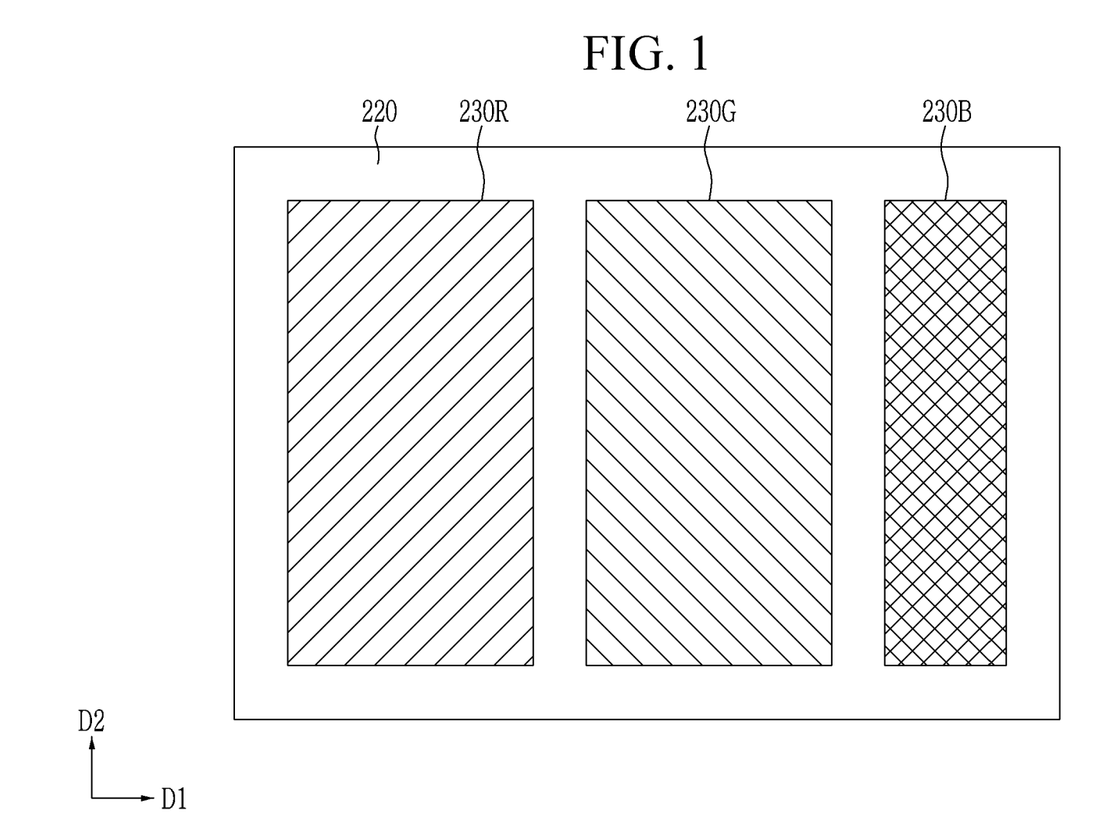
FIG. 1 is a top plan view of a unit of a color conversion panel according to an exemplary embodiment.
Figure 2:
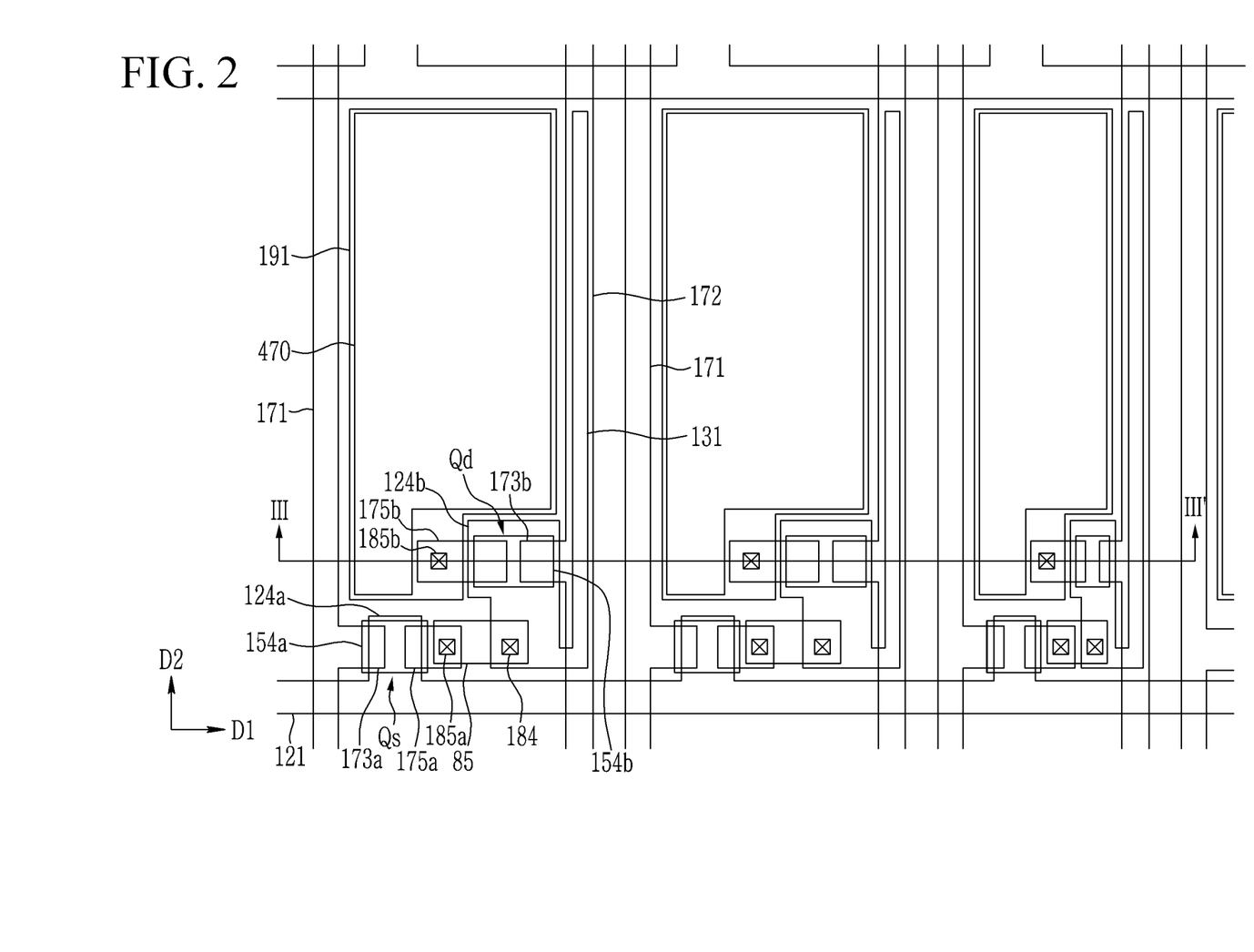
FIG. 2 is a top plan view of a plurality of pixels of the display panel corresponding to the unit of FIG. 1.
Figure 3:
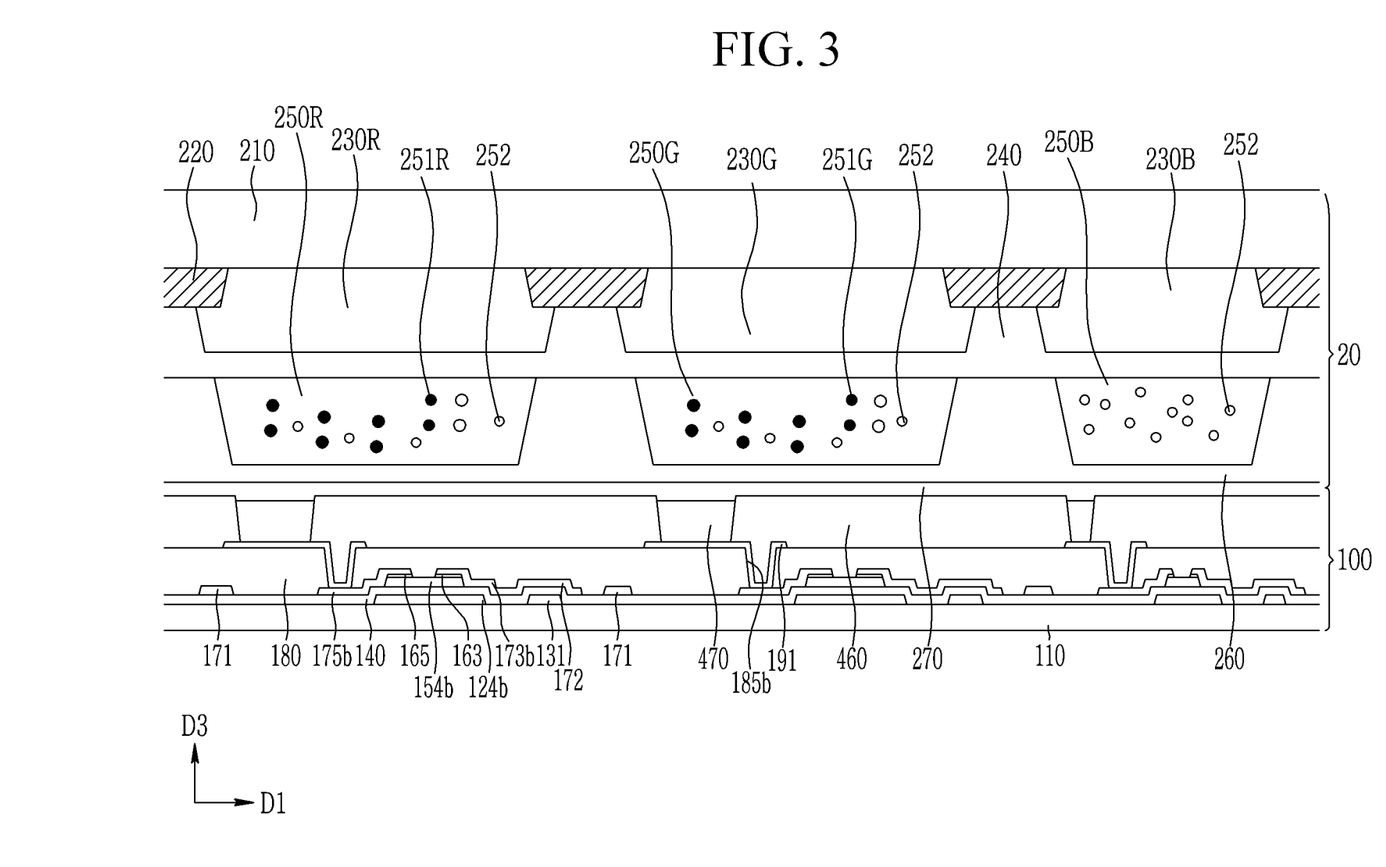
FIG. 3 is a cross-sectional view taken along a line III-III' of FIG. 2.

Now, a display device according to an exemplary embodiment will be described with reference to FIG. 1 to FIG. 3. FIG. 1 is a top plan view of a unit of a color conversion panel according to an exemplary embodiment, FIG. 2 is a top plan view of a plurality of pixels of the display panel corresponding to the unit of FIG. 1, and FIG. 3 is a cross-sectional view taken along a line of FIG. 2.

In a display device according to an exemplary embodiment, a unit shown in FIG. 1 may be repeatedly disposed in a matrix shape. The unit may include a red color filter 230R, a green color filter 230G, and a blue color filter 230B that are arranged along a first direction D1. Also, a light blocking member 220 defining the red color filter 230R, the green color filter 230G, and the blue color filter 230B is included along the first direction D1 and the second direction D2. The light blocking member 220 may have a lattice shape according to an example.

A plane size of the red color filter 230R and the green color filter 230G and a plane size of the blue color filter 230B may be different from one another. The plane size of the red color filter 230R and the green color filter 230G may be larger than the plane size of the blue color filter 230B. As an example, the plane size of the red color filter 230R and the green color filter 230G may be more than about two times the plane size of the blue color filter 230B.

The display device according to an exemplary embodiment provides the light blocking member 220 enclosing the red color filter 230R, the green color filter 230G, and the blue color filter 230B. The light blocking member 220 according to an exemplary embodiment may include at least one among a blue pigment and/or a blue dye.

As the areas of the red color filter 230R, the green color filter 230G, and the blue color filter 230B are differentiated, reflectance of external light is differentiated, thereby causing a color distortion according thereto. A large amount of red light and green light may be reflected in the red color filter 230R and the green color filter 230G having a relatively wide area, and a small amount of blue light may be reflected in the blue color filter 230B having a relatively narrow area. As above-described, the light of the distorted color may be provided according to the non-uniform reflection of the external light.

As the light blocking member 220 according to an exemplary embodiment includes the blue pigment or the blue dye, the blue light may also be reflected in the region where the light blocking member 220 is positioned. The reflectance of the red light, the green light, and the blue light may be evenly (e.g., substantially evenly) provided by improving the reflectance of the blue light.

In the unit shown in FIG. 1, as the area of the light blocking member 220 decreases, a content of the blue dye or the blue pigment included in the light blocking member 220 may be increased. As the area of the light blocking member 220 increases in the unit, the content of the blue dye or the blue pigment may be decreased. This is to uniformly (e.g., substantially uniformly) provide the reflectance of the blue light provided in the unit.

Similarly, as the area of the light blocking member 220 decreases in the unit, a content of carbon black included in the light blocking member 220 may be decreased. In the unit, as the area of the light blocking member 220 increases, the content of the carbon black of the light blocking member 220 may be increased. This is to uniformly (e.g., substantially uniformly) provide the reflectance provided by the light blocking member 220 regardless of the area of the light blocking member 220.

Also, the thickness of the light blocking member 220 may be differentiated depending on the embodiment, and when a relatively small amount of blue light reflection is required, the thickness of the light blocking member 220 may be relatively thinner.

Next, a plurality of pixels corresponding to the above-described unit will be described with reference to FIG. 2 and FIG. 3.

A display panel 100 includes a gate conductor positioned on a first substrate 110 and including a gate line 121 including a first gate electrode 124a, a second gate electrode 124b, and an extension part 131 extending from the second gate electrode 124b.

A gate insulating layer 140 including a silicon nitride (SiNx) or a silicon oxide (SiOx) is positioned on the gate conductor.

A first semiconductor layer 154a and a second semiconductor layer 154b including amorphous silicon, polysilicon, or an oxide semiconductor are positioned on the gate insulating layer 140. The first semiconductor layer 154a and the second semiconductor layer 154b respectively overlap the first gate electrode 124a and the second gate electrode 124b.

Ohmic contacts 163 and 165 are positioned on the first semiconductor layer 154a and the second semiconductor layer 154b. The ohmic contacts may be omitted according to an exemplary embodiment.

A data conductor including a data line 171 including a first source electrode 173a, a driving voltage line 172 including a second source electrode 173b, a first drain electrode 175a, and a second drain electrode 175b is positioned on the ohmic contacts 163 and 165 and the gate insulating layer 140.

The first source electrode 173a and the first drain electrode 175a face each other with respect to the first gate electrode 124a, and the second source electrode 173b and the second drain electrode 175b face each other with respect to the second gate electrode 124b.

A passivation layer 180 is positioned on the data conductor and the exposed semiconductor layers 154a and 154b.

The passivation layer 180 includes contact holes 185a and 185b respectively overlapping the first drain electrode 175a and the second drain electrode 175b. The passivation layer 180 and the gate insulating layer 140 include a contact hole 184 overlapping the second gate electrode 124b.

A pixel electrode 191 and a connecting member 85 are positioned on the passivation layer 180. The pixel electrode 191 is physically and electrically coupled to (e.g., electrically connected to) the second drain electrode 175b through the contact hole 185b, and the connecting member 85 is coupled to (e.g., connected to) the second gate electrode 124b and the first drain electrode 175a through the contact holes 184 and 185a.

A partition wall 460 is positioned on the passivation layer 180. The partition wall 460 encloses the edge of the pixel electrode 191 like a bank, and is made of an organic insulator or an inorganic insulator.

An emission layer 470 is positioned on the pixel electrode 191. The emission layer 470 of the emissive display device according to the present exemplary embodiment may emit the blue light.

A general emissive display device includes materials uniquely emitting one light among primary colors such as three primary colors such as red, green, and blue, however, in the case of the emissive display device according to the present exemplary embodiment, the color conversion panel 20 is positioned at the upper surface of the emissive display device and each color of red, green, and blue may be expressed, and accordingly, only the material emitting the blue light may be included.

The present specification shows the emission layers 470 positioned to be separated from each other for each pixel, however it is not limited thereto, and emission layers 470 positioned in adjacent pixels may be coupled to (e.g., connected to) each other. The emission layer positioned at the region emitting the red light, the emission layer positioned at the region emitting the green light, and the emission layer positioned at the region emitting the blue light may be coupled to (e.g., connected to) each other.

A common electrode 270 is positioned on the emission layer 470.

In the emissive display device, the first gate electrode 124a coupled to (e.g., connected to) the gate line 121, the first source electrode 173a coupled to (e.g., connected to) the data line 171, and the first drain electrode 175a form a switching transistor Qs along with the first semiconductor layer 154a, and the channel of the switching transistor Qs is formed in the first semiconductor layer 154a between the first source electrode 173a and the first drain electrode 175a. The second gate electrode 124b coupled to (e.g., connected to) the first drain electrode 175a, the second source electrode 173b coupled to (e.g., connected to) the driving voltage line 172, and the second drain electrode 175b coupled to (e.g., connected to) the pixel electrode 191 form a driving transistor Qd along with the second semiconductor layer 154b, and the channel of the driving transistor Qd is formed in the second semiconductor layer 154b between the second source electrode 173b and the second drain electrode 175b. The pixel electrode 191, the emission layer 470, and the common electrode 270 form a light emitting diode (LED) OLED, and in this case, the pixel 191 may be an anode and the common electrode 270 may be a cathode, or conversely, the pixel electrode 191 may be a cathode and the common electrode 270 may be an anode.

The display device may emit the light upward and/or downward with respect to the first substrate 110 to display the image, and the exemplary embodiment in which the light is emitted upward with respect to the first substrate 110 is described according to an exemplary embodiment of the present disclosure.

The color conversion panel 20 includes a substrate 210 overlapping the display panel 100. The color filters 230R, 230G, and 230B and the light blocking member 220 included in the color conversion panel 20 are the same as the color filters 230R, 230G, and 230B and the light blocking member 220 described with reference to FIG. 1 such that repeated detailed description thereof is not necessary.

The red color filter 230R, the green color filter 230G, and the blue color filter 230B described above are alternately positioned along the first direction D1 between the substrate 210 and the display panel 100.

The light blocking member 220 prevents or reduces color mixture of different light emitted from the adjacent pixels, and may define the regions where the red color filter 230R, the green color filter 230G, and the blue color filter 230B are disposed.

A first planarization layer 240 is positioned between the light blocking member 220, the red color filter 230R, the green color filter 230G, and the blue color filter 230B, and the display panel 100. The first planarization layer 240 may be a layer for flattening one surface of the light blocking member 220, the red color filter 230R, the green color filter 230G, and the blue color filter 230B. The first planarization layer 240 may include at least one of the organic material and/or the inorganic material.

A red color conversion layer 250R, a green color conversion layer 250G, and a transmissive layer 250B may be positioned between the first planarization layer 240 and the display panel 100. The red color conversion layer 250R, the green color conversion layer 250G, and the transmissive layer 250B may be repeatedly arranged along the first direction D1.

The red color conversion layer 250R and the green color conversion layer 250G convert the light incident from the display panel 100 to be emitted. The transmissive layer 250B emits the incident light as it is without conversion of the incident light. As an example, the blue light is incident into the transmissive layer 250B and the blue light may be emitted as it is.

The red color conversion layer 250R may include a first semiconductor nanocrystal 251R converting the incident blue light into the red light. The first semiconductor nanocrystal 251R may include at least one of a phosphor and/or a quantum dot.

The green color conversion layer 250G may include a second semiconductor nanocrystal 251G converting the incident blue light into the green light. The second semiconductor nanocrystal 251G may include at least one of the phosphor and/or the quantum dot.

The quantum dot included in the first semiconductor nanocrystal 251R and the second semiconductor nanocrystal 251G may be independently selected from a Group II-VI compound, a Group III-V compound, a Group IV-VI compound, a Group IV element, a Group IV compound, and a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a four-element compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof. The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may be present in particles at uniform (e.g., substantially uniform) concentrations, or they may be divided into states having partially different concentrations to be present in the same particle, respectively. In addition, a core/shell structure in which some quantum dots enclose some other quantum dots may be possible. An interface between the core and the shell may have a concentration gradient in which a concentration of elements of the shell decreases closer to its center.

The quantum dot may emit light having a full width at half maximum (FWHM) of the light-emitting wavelength spectrum that is equal to or less than about 45 nm, for example, equal to or less than about 40 nm, or for example, equal to or less than about 30 nm, and in this range, color purity or color reproducibility may be improved. In addition, since light emitted through the quantum dot is emitted in all directions, a viewing angle of the light may be improved.

The first semiconductor nanocrystal 251R includes a red phosphor, and the red phosphor may include at least one selected from a group including (Ca, Sr, Ba)S, (Ca, Sr, Ba)2Si5N8, CaAlSiN3, CaMoO4, and Eu2Si5N8, but the present disclosure is not limited thereto.

The second semiconductor nanocrystal 251G includes a green phosphor, and the green phosphor may include at least one selected from a group including yttrium aluminum garnet (YAG), (Ca, Sr, Ba)2SiO4, SrGa2S4, BAM, α-SiAlON, δ-SiAlON, Ca3Sc2Si3O12, Tb3Al5O12, BaSiO4, CaAlSiON, and (Sr(1−x)Bax)Si2O2N2, but the present disclosure is not limited thereto. The x may be any number between 0 and 1.

The transmissive layer 250B may pass incident light as it is. The transmissive layer 250B may include a resin passing blue light. The transmissive layer 250B positioned at the region emitting the blue light does not separately include the semiconductor nanocrystal, and passes the incident blue as it is.

The transmissive layer 250B may further include at least one of the dye and/or the pigment. The transmissive layer 250B including the dye or pigment may reduce the external light reflection, and may provide the blue light with improved color purity.

At least one among the red color conversion layer 250R, the green color conversion layer 250G, and/or the transmissive layer 250B may further include a scatterer 252. The content of each scatterer 252 included in the red color conversion layer 250R, the green color conversion layer 250G, and the transmissive layer 250B may be different.

The scatterer 252 may increase an amount of light that is converted in or passes through the color conversion layers 250R and 250G and the transmissive layer 250B and then is emitted, and may uniformly (e.g., substantially uniformly) provide front luminance and lateral luminance.

The scatterer 252 may include any suitable material capable of evenly (e.g., substantially evenly) scattering incident light. The scatterer 252 may include at least one among TiO2, ZrO2, Al2O3, In2O3, ZnO, SnO2, Sb2O3, and/or ITO.

The red color conversion layer 250R, the green color conversion layer 250G, and the transmissive layer 250B may include a photosensitive resin, and may be formed through a photolithography process. In addition, they may be formed through a printing process or an inkjet process, and in the case of these processes, the red color conversion layer 250R, the green color conversion layer 250G, and the transmissive layer 250B may include a material that is not the photosensitive resin. In the present specification, although it is described that the color conversion layer and the transmissive layer are formed through the photolithography process, the printing process, or the inkjet process, the present disclosure is not limited thereto.

Each plane area of the red color conversion layer 250R and the green color conversion layer 250G may be different from the plane area of the transmissive layer 250B. As an example, each plane area of the red color conversion layer 250R and the green color conversion layer 250G may be larger than the plane area of the transmissive layer 250B. The conversion of the light is required in the red color conversion layer 250R and the green color conversion layer 250G, and the light is emitted as it is without the wavelength conversion of the incident light in the transmissive layer 250B. In order for the light to be emitted in balance from the light emitted from the red color conversion layer 250R, the green color conversion layer 250G, and the transmissive layer 250B, the plane area of the red color conversion layer 250R and the green color conversion layer 250G may be larger than the plane area of the transmissive layer 250B.

The red color conversion layer 250R may overlap the red color filter 230R along the third direction D3, the green color conversion layer 250G may overlap the green color filter 230G along the third direction D3, and the transmissive layer 250B may overlap the blue color filter 230B along the third direction D3.

According to an exemplary embodiment, the plane shape of the red color conversion layer 250R and the plane shape of the red color filter 230R may be substantially the same as one another. Also, the plane shape of the green color conversion layer 250G and the plane shape of the green color filter 230G may be substantially the same as one another. Further, the plane shape of the transmissive layer 250B and the plane shape of the blue color filter 230B may be substantially the same as one another.

A second planarization layer 260 is positioned between the red color conversion layer 250R and the green color conversion layer 250G, and the display panel 100, and between the transmissive layer 250B and the display panel 100. The second planarization layer 260 may overlap the entire surface of the substrate 210.

The second planarization layer 260 may flatten one surface of the red color conversion layer 250R, the green color conversion layer 250G, and the transmissive layer 250B. The second planarization layer 260 includes an organic material, but is not limited thereto, and may include any suitable material having the flattening function.

The present specification shows an exemplary embodiment in which the display panel 100 and the color conversion panel 20 are directly in contact with each other, however it is not limited thereto, and the display panel 100 and the color conversion panel 20 may be combined by a separate adhesive layer, a sealant, or various suitable disclosed methods.

In the case of the display device according to an exemplary embodiment, the area of the blue color filter may be smaller than the area of the red color filter and the area of the green color filter. In this case, the distortion of the color provided to a user may be generated by a difference of the light amount reflected from each color filter. In the present disclosure, as the light blocking member includes the blue pigment or the blue dye in order to improve the reflectance of the blue light, balanced reflection light may be provided and the color reproducibility may be improved.

Figure 4:
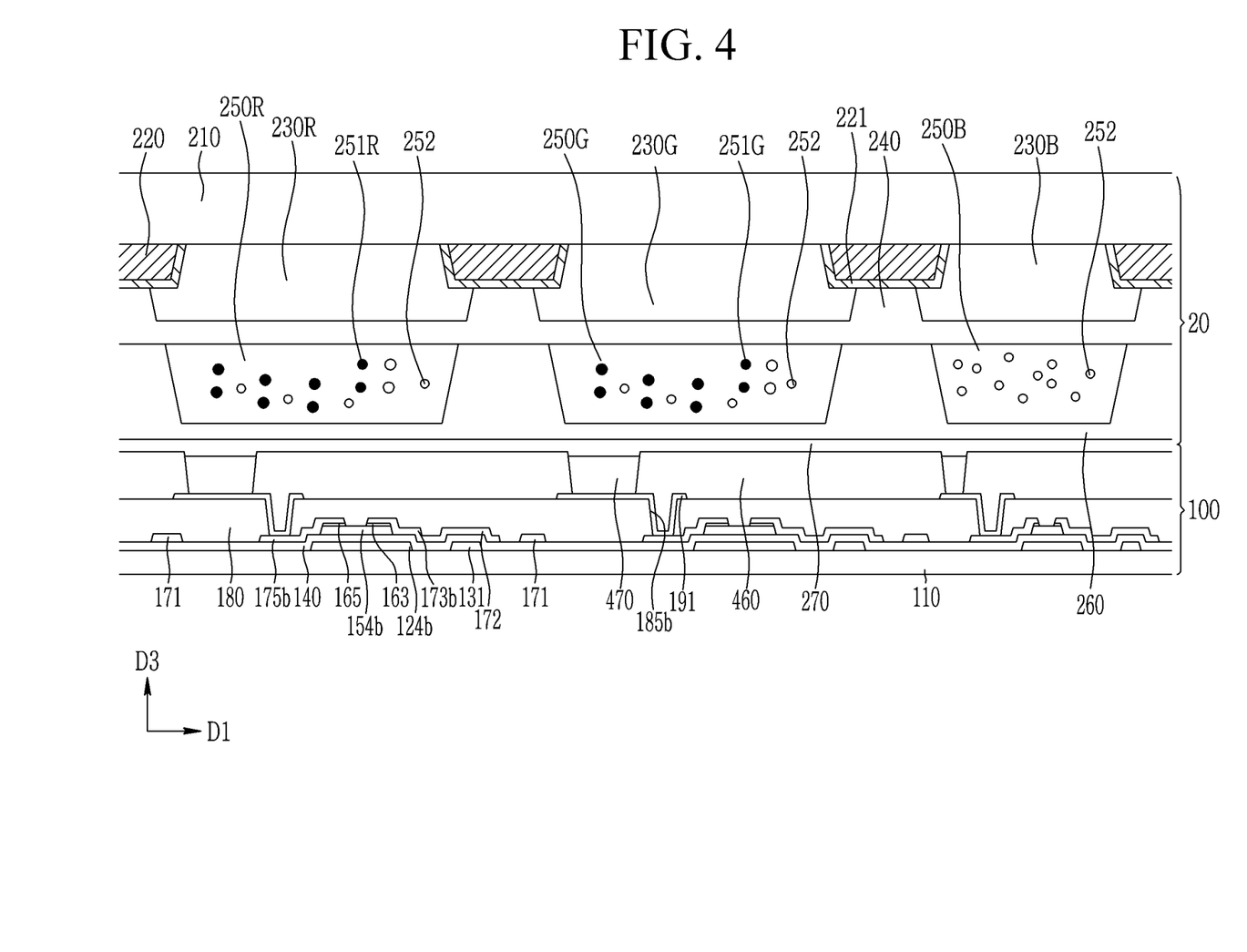
FIG. 4 is a cross-sectional view according to a variation of the exemplary embodiment of FIG. 3.

Next, the display device according to another exemplary embodiment will be described with reference to FIG. 4. FIG. 4 is a cross-sectional view according to a variation exemplary embodiment of FIG. 3. Repeated description of the same configurations as in the above-described constituent elements is not necessary.

The display device according to the exemplary embodiment of FIG. 4 further include a metal reflective layer 221 between the light blocking member 220 and the color filters 230R, 230G, and 230B. The metal reflective layer 221 may include any suitable metal for reflecting the light.

The metal reflective layer 221 may again reflect the light reflected from the red color conversion layer 250R, the green color conversion layer 250G, or the transmissive layer 250B to the direction of the metal reflective layer 221 in the direction of the red color conversion layer 250R, the green color conversion layer 250G, and/or the transmissive layer 250B. The reflected light may be again emitted to the direction outside the substrate 210 by the first semiconductor nanocrystal 251R or the second semiconductor nanocrystal 251G. The emission efficiency may be improved through the metal reflective layer 221.

Figure 5:
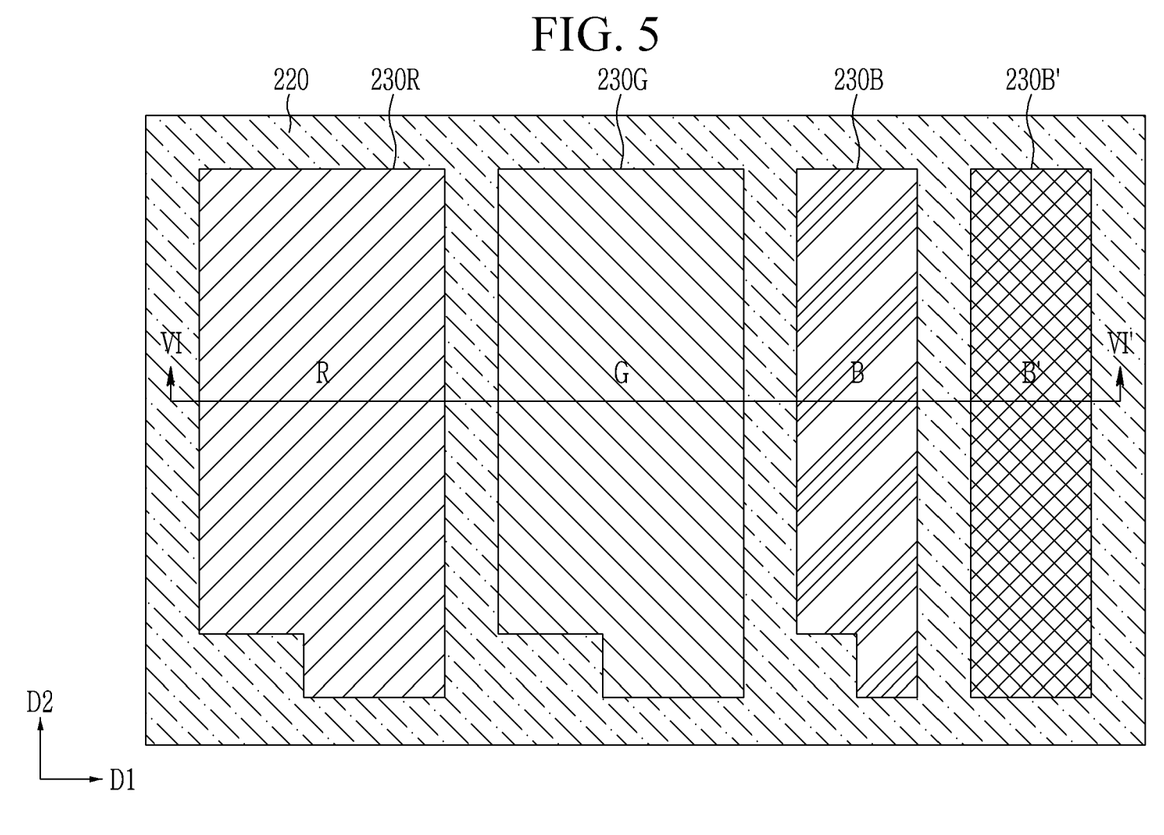
FIG. 5 is a top plan view of a unit of a color conversion panel according to an exemplary embodiment.
Figure 6:
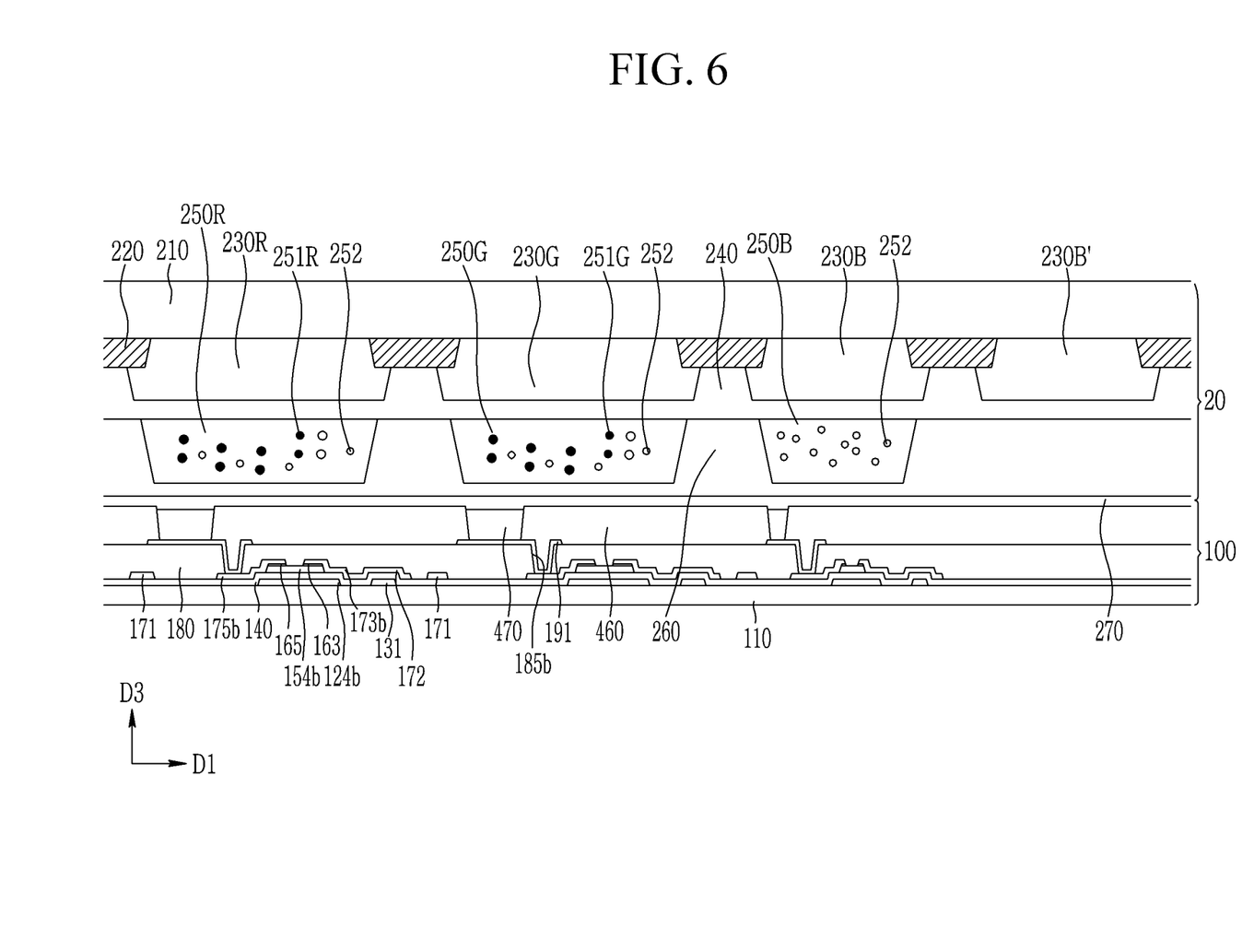
FIG. 6 is a cross-sectional view of a display device corresponding to the unit of FIG. 5.
Figure 7:
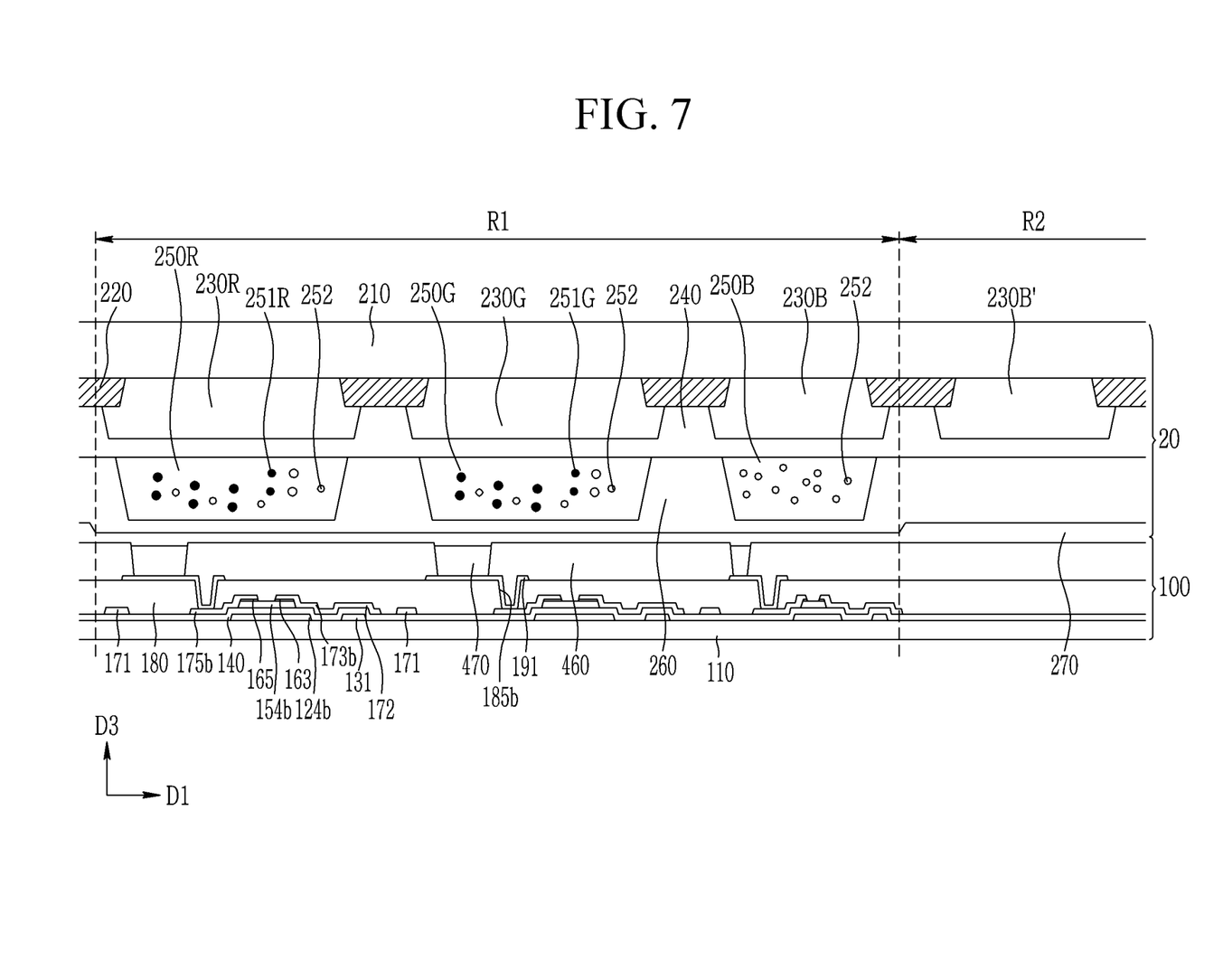
FIG. 7 is a cross-sectional view according to a variation of the exemplary embodiment of FIG. 6.

The display device according to an exemplary embodiment will be described with reference to FIG. 5 to FIG. 7. FIG. 5 is a top plan view of a unit of a color conversion panel according to an exemplary embodiment, FIG. 6 is a cross-sectional view of a display device corresponding to the unit of FIG. 5, and FIG. 7 is a cross-sectional view according to a variation exemplary embodiment of FIG. 6.

FIG. 5 is a top plan view of a unit of a color conversion panel according to an exemplary embodiment. The display device may be shaped such that a plurality of units are repeatedly disposed in a matrix shape, and may have a shape in which the units shown in FIG. 5 are repeatedly disposed.

As shown in FIG. 5, the color conversion panel according to an exemplary embodiment may include the red color filter 230R, the green color filter 230G, the blue color filter 230B, and a reflective blue color filter 230B' that are arranged along the first direction D1.

The red color filter 230R may overlap the red color conversion layer 250R along the third direction D3, and the green color filter 230G may overlap the green color conversion layer 250G along the third direction D3. The blue color filter 230B may overlap the transmissive layer 250B along the third direction D3. The reflective blue color filter 230B' does not overlap the red color conversion layer 250R, the green color conversion layer 250G, or the transmissive layer 250B. Also, the reflective blue color filter 230B' does not overlap the emission layer 470.

The reflective blue color filter 230B' does not overlap the emission layer 470, so it does not spontaneously emit the light. There is reflection of the blue light due to the external light in the reflective blue color filter 230B', and the reflectance of the blue light may be increased.

The reflective blue color filter 230B' may be the same (e.g., substantially the same) color filter as the blue color filter 230B or the color filter having the different transmittance or reflectance of the blue light.

The reflective blue color filter 230B' according to an exemplary embodiment is shown with a rectangular shape disposed along the first direction D1, however it is not limited thereto, and it may have any suitable shape or position.

As shown in FIG. 6, the reflective blue color filter 230B' may overlap the second planarization layer 260.

According to an exemplary embodiment, the area occupied with the blue color filter 230B is small compared with the area occupied with the red color filter 230R and the area occupied with the green color filter 230G. The reflectance of the blue light by the reflection of the external light may be smallest, and accordingly, the distortion of the provided color may be generated. However, according to an exemplary embodiment, as the reflective blue color filter 230B' is provided, the blue light reflectance by the reflection of the external light may be improved. The reflectance of the red light, the green light, and the blue light may be balanced, and accordingly the color reproducibility may be improved without the distortion of the light provided to the user.

Referring to FIG. 7, the common electrode 270 according to an exemplary embodiment may include regions in which the thickness thereof is differentiated. The common electrode 270 may include a first region R1 having a relatively thin thickness and a second region R2 having a relatively thick thickness.

The first region R1 may overlap the red color conversion layer 250R, the green color conversion layer 250G, and the transmissive layer 250B. The first region R1 may overlap the red color filter 230R, the green color filter 230G, and the blue color filter 230B. The second region R2 may overlap the reflective blue color filter 230B'.

External light reflectance in the second region R2 may be larger than external light reflectance of the first region R1. Since more light is reflected in the second region R2 overlapping the reflective blue color filter 230B', the reflection efficiency of the blue light may be increased.

Figure 8:
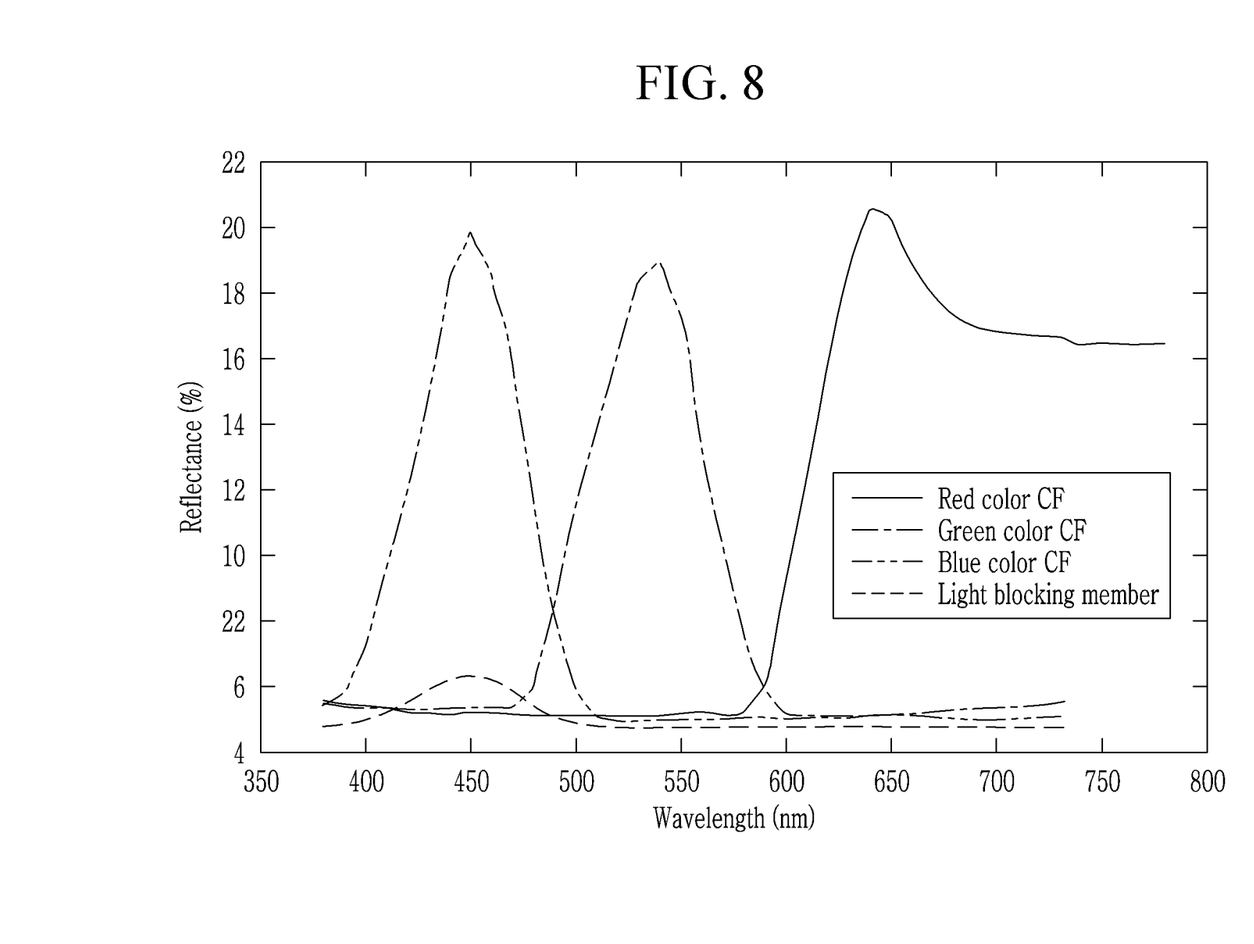
FIG. 8 is a reflectance graph of a color filter and a light blocking member according to the exemplary embodiment of FIG. 1.

Next, the reflectance according to the exemplary embodiment and the comparative example will be described with reference to FIG. 8 and FIG. 9. FIG. 8 is a reflectance graph of a color filter and a light blocking member according to an exemplary embodiment of FIG. 1, and FIG. 9 is a reflectance graph according to an exemplary embodiment and a comparative example.

Referring to FIG. 8, a set (e.g., predetermined reflectance) may be represented in each of the red CF (color filter), the green CF, and the blue CF in the display device according to an exemplary embodiment. Also, it may be confirmed that some additional reflection is generated in the blue light region by the light blocking member including the blue dye.

In the display device according to an exemplary embodiment, the area occupied with the blue color filter is small compared with the area occupied with the red color filter and the green color filter. When the red color filter, the green color filter, and the blue color filter have the same (e.g., substantially the same) reflectance, the reflectance of the blue light may be lower by the area difference. However, in the display device according to an exemplary embodiment, since the light blocking member may reflect the blue light, the low reflectance of the blue light due to the area difference may be compensated. The red light, the green light, and the blue light may be uniformly (e.g., substantially uniformly) reflected throughout the entire display device. Accordingly, the light with improved color reproducibility may be provided to the user without the light distortion.

Figure 9:
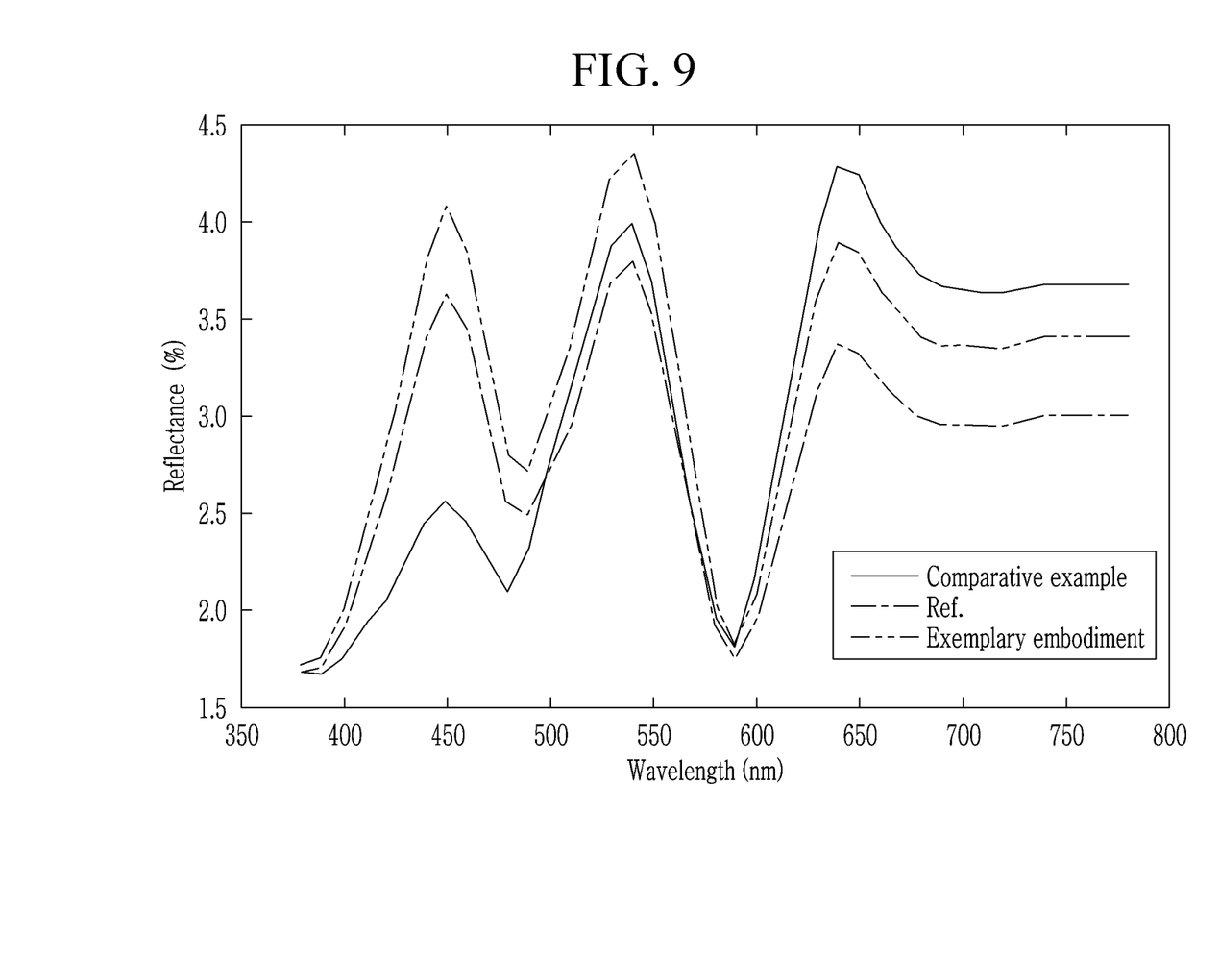
FIG. 9 is a reflectance graph according to an exemplary embodiment and a comparative example.

Referring to FIG. 9, in the case of the exemplary embodiment, it may be confirmed that the reflectance of an equal or similar level is shown in the blue light wavelength region, the green light wavelength region, and the red light wavelength region. It may be confirmed that a form similar to the reference graph (Ref) without color distortion appears.

However, in a case of a comparative example in which the light blocking member does not include the blue dye and the blue pigment, it may be confirmed that the reflectance is remarkably lower in the blue light region. When the areas of the red color filter, the green color filter, and the blue color filter are different from one another, the reflectance of the blue light is low compared with the red light and the green light, and accordingly the color may be distorted.

Also, in the display device according to an exemplary embodiment, it may be confirmed that luminance of about 103.2% is manifested. Luminance of about 90.01% is manifested in a reference display device Ref, and luminance of about 100% is manifested in the display device according to the comparative example. In the case of the display device according to an exemplary embodiment, as the reflectance of the blue light is increased, the color reproducibility is not only improved, but the luminance improvement effect may also be confirmed.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of the present disclosure has been described in connection with what is presently considered to be practical exemplary embodiments, it is to be understood that the subject matter of the present disclosure is not limited to the disclosed embodiments, but, on the contrary, is intended to cover various modifications and equivalent arrangements included within the spirit and scope of the appended claims, and equivalents thereof.

DESCRIPTION OF SOME OF THE SYMBOLS

100: display panel
20: color conversion panel

220: light blocking member
230R red color filter
230G: green color filter
230B: blue color filter
250R: red color conversion layer
250G: green color conversion layer
250B: transmissive layer

What is claimed is:

1. A display device comprising:
a display panel; and
a color conversion panel overlapping the display panel,
wherein the color conversion panel comprises:
a red color conversion layer and a green color conversion layer comprising a semiconductor nanocrystal, and a transmissive layer;
a red color filter overlapping the red color conversion layer;
a green color filter overlapping the green color conversion layer; and
a blue color filter overlapping the transmissive layer and a light blocking member,
the light blocking member comprises at least one of a blue dye and a blue pigment, and
plane areas of the red color conversion layer, the green color conversion layer, and the transmissive layer are different from one another.

2. The display device of claim 1, wherein:
each plane area of the red color conversion layer and the green color conversion layer is larger than a plane area of the transmissive layer.

3. The display device of claim 1, wherein:
in the color conversion panel,
a unit comprising the red color filter, the green color filter, the blue color filter, and the light blocking member comprises a plurality of the units repeatedly arranged.

4. The display device of claim 3, wherein:
as the area occupied with the light blocking member is decreased in one of the plurality of the units relative to another one of the plurality of the units, a content of the blue dye or the blue pigment included in the light blocking member is increased in the one unit relative to the other unit.

5. The display device of claim 3, wherein:
the light blocking member comprises carbon black, and
a content of the carbon black is increased in one of the plurality of the units relative to another one of the plurality of the units as the area occupied with the light blocking member is increased in the one unit relative to the other unit.

6. The display device of claim 1, wherein:
the display panel emits blue light.

7. The display device of claim 1, wherein:
the color conversion panel comprises a substrate,
the red color filter, the green color filter, and the blue color filter are positioned between the substrate and the display panel, and
the red color conversion layer, the green color conversion layer, and the transmissive layer are disposed between the red color filter and the display panel.

8. The display device of claim 7, wherein:
a planarization layer is positioned between the red color filter and the red color conversion layer, between the green color filter and the green color conversion layer, and between the blue color filter and the transmissive layer.

9. The display device of claim 1, further comprising:
a metal reflective layer positioned in at least one among between the light blocking member and the red color filter, between the light blocking member and the green color filter, and between the light blocking member and the blue color filter.

10. A display device comprising:
a display panel; and
a color conversion panel overlapping the display panel,
wherein the color conversion panel comprises:
a red color conversion layer and a green color conversion layer comprising a semiconductor nanocrystal, and a transmissive layer;
a red color filter overlapping the red color conversion layer;
a green color filter overlapping the green color conversion layer; and
a blue color filter overlapping the transmissive layer and a light blocking member,
the light blocking member comprises at least one of a blue dye and a blue pigment, and
plane areas of the red color filter, the green color filter, and the blue color filter are different from one another.

11. The display device of claim 10, wherein:
each plane area of the red color filter and the green color filter is larger than a plane area of the blue color filter.

12. A display device comprising:
a display panel; and
a color conversion panel overlapping the display panel,
wherein the color conversion panel comprises:
a red color conversion layer and a green color conversion layer comprising a semiconductor nanocrystal, and a transmissive layer;
a red color filter overlapping the red color conversion layer;
a green color filter overlapping the green color conversion layer; and
a blue color filter overlapping the transmissive layer and a light blocking member, and
each plane area of the red color conversion layer and the green color conversion layer is larger than the plane area of the transmissive layer.

13. The display device of claim 12, further comprising:
a reflective blue color filter positioned on the same layer as the blue color filter.

14. The display device of claim 13, wherein:
the display panel comprises a light emitting diode (LED) coupled to a thin film transistor, and
the light emitting diode (LED) comprises:
a pixel electrode coupled to the thin film transistor,
a common electrode overlapping the pixel electrode, and
an emission layer positioned between the pixel electrode and the common electrode.

15. The display device of claim 14, wherein:
the red color conversion layer, the green color conversion layer, and the transmissive layer overlap the emission layer.

16. The display device of claim 14, further comprising:
a planarization layer positioned between the red color conversion layer and the green color conversion layer, and the display panel, and between the transmissive layer and the display panel.

17. The display device of claim 16, wherein:
the planarization layer overlaps the reflective blue color filter.

18. The display device of claim 14, wherein:
the common electrode comprises:
a first region overlapping the red color filter, the green color filter, and the blue color filter, and
a second region overlapping the reflective blue color filter, and
a thickness of the common electrode positioned in the first region and the second region is differentiated.

19. The display device of claim 18, wherein:
the thickness of the common electrode positioned at the first region is smaller than the thickness of the common electrode positioned at the second region.

* * * * *